(12) United States Patent
Rubenstein (10) Patent No.: US 7,420,816 B2
(45) Date of Patent: Sep. 2, 2008

(54) APPARATUS AND METHOD FOR INSTALLING AN ELECTRICAL SUPPORT STRUCTURE

(75) Inventor: Brandon Rubenstein, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/532,312

(22) Filed: Sep. 15, 2006

(65) Prior Publication Data

US 2008/0068813 A1    Mar. 20, 2008

(51) Int. Cl.
*H05K 5/00*    (2006.01)

(52) U.S. Cl. .................. 361/759; 361/756; 361/727; 361/748

(58) Field of Classification Search .............. 395/800; 361/796, 759, 756, 727, 748
See application file for complete search history.

(56) References Cited

U.S. PATENT DOCUMENTS

| | | | |
|---|---|---|---|
| 5,440,755 A * | 8/1995 | Harwer et al. .............. | 710/315 |
| 5,657,204 A | 8/1997 | Hunt | |
| 5,980,281 A | 11/1999 | Neal et al. | |
| 6,033,254 A * | 3/2000 | Neal et al. .................. | 439/377 |
| 6,233,158 B1 | 5/2001 | Leman | |
| 6,373,712 B1 * | 4/2002 | Bailis et al. ................. | 361/756 |
| 6,377,445 B1 | 4/2002 | Davis et al. | |
| 6,411,517 B1 * | 6/2002 | Babin ......................... | 361/759 |
| 6,667,890 B1 | 12/2003 | Barringer et al. | |
| 6,731,515 B2 * | 5/2004 | Rhoads ....................... | 361/796 |
| 6,761,569 B2 | 7/2004 | Nakamura | |
| 6,776,632 B2 | 8/2004 | Kikuchi et al. | |
| 6,783,926 B2 | 8/2004 | Reece | |
| 6,786,409 B2 | 9/2004 | Fujii et al. | |
| 6,786,410 B2 | 9/2004 | Kihara | |
| 6,840,447 B2 | 1/2005 | Hirata et al. | |
| 6,878,000 B2 | 4/2005 | Akasaka et al. | |
| 6,883,715 B1 | 4/2005 | Fruhauf et al. | |
| 6,884,100 B1 | 4/2005 | Hsiao | |
| 6,923,373 B2 | 8/2005 | Kanagawa et al. | |
| 6,942,149 B2 | 9/2005 | Fujii et al. | |
| 6,976,860 B1 | 12/2005 | Su | |
| 7,033,222 B2 | 4/2006 | Kitamura | |
| 7,047,631 B1 | 5/2006 | Spaulding | |
| 2005/0281014 A1 * | 12/2005 | Carullo et al. .............. | 361/796 |
| 2006/0087801 A1 | 4/2006 | Champion et al. | |

OTHER PUBLICATIONS

Picture of IBM P650 PCI Carrier, admitted prior art.
Picture of SGI PCI Carrier, admitted prior art.
Picture of Sun PCI Carrier, admitted prior art.

* cited by examiner

*Primary Examiner*—Dean A. Reichard
*Assistant Examiner*—Andargie M Aychillhum (57) ABSTRACT

An apparatus and method for installing an electrical support structure, such as a printed circuit board or card within a computerized device, are disclosed. In at least some embodiments, the apparatus includes a first structure, a second structure supported by the first structure and capable of movement with respect to the first structure along a first direction, and a third structure slidingly supported by the second structure. Sliding motion of the third structure with respect to the second structure results in movement of the third structure relative to the first structure that is along a second direction different from the first direction.

20 Claims, 11 Drawing Sheets

APPARATUS AND METHOD FOR INSTALLING AN ELECTRICAL SUPPORT STRUCTURE

CROSS-REFERENCE TO RELATED APPLICATIONS

STATEMENT REGARDING FEDERALLY SPONSORED RESEARCH OR DEVELOPMENT

FIELD OF THE INVENTION

The present invention relates to computerized devices, and more particularly relates to the assembly of components such as boards and cards within such devices.

BACKGROUND OF THE INVENTION

Computers and other computerized devices often employ boards (e.g., printed circuit boards), cards and other support structures on which are implemented various electrical devices and circuitry such as microprocessors, programmable logic devices (PLDs), and discrete circuit components. Often these support structures are intended to be modular such that the structures can be removed, replaced and/or added in relation to one another and/or other parts of a given computerized device. Typically, support structures of this type include connectors that are capable of being coupled to complementary connectors of other support structures or devices so that electrical connections can be established, and that at the same time facilitate (or at least permit) the repeated coupling and decoupling of the support structures to and from one another. Many conventional boards (or cards) are designed to be coupled to one another in a perpendicular manner. That is, conventional boards are often designed so that, when a first board is coupled to a second board, an edge of the first board is positioned adjacent to a substantially planar surface of the second board and the first board extends substantially normally outward from the substantially planar surface of the second board. Additionally, to establish electrical connections between the boards, the boards typically have or operate in conjunction with complementary connection components that interface one another when the boards are coupled to one another. For example, in some embodiments, connector pins extending normally from the planar surface of the second board can interface complementary electrical sockets associated with the first board. Also, in some embodiments, this can also be accomplished with a connector style in which the add-in board has electrical contacts etched onto its surface and the connector on the mating board has conductors that mate to these contacts.

The assembly of boards in this perpendicular manner is common because it satisfies various design goals, for example, the enhancement of heat dissipation from the boards. Yet the assembly of boards in this manner also leads to complications in terms of the process of assembling the boards. Given the design of typical electrical connection components such as those mentioned above, the assembly of boards in this perpendicular manner naturally calls for movement of the first board in a direction that is normal to the surface of the second board so that pins can proceed into complementary sockets. Yet, movement of a first board in a direction that is normal to the surface of a second board is sometimes unwieldy and impractical in the context of assembling boards on a computerized device. Indeed, if such movement is required in order to assemble boards together, it often becomes necessary that all of the boards be entirely removed from a supportive chassis of the computerized device before the assembly process can take place.

Given these complications, efforts have been made to develop boards and/or connection components that would allow for a first board to be assembled to a second board in a manner that did not involve as much normal motion of the first board relative to the surface of the second board. These efforts have yielded boards and/or connection components in which assembly of the first and second boards is accomplished by first moving the first board in relation to the second board along the surface of the second board (rather than normally toward the surface of the second board), where the first board is sufficiently far apart from the second board such that any connectors such as pins/sockets are not yet in contact with one another, followed by moving the first board slightly in a direction toward the surface of the second board so that contact among the connectors then is established. In such mechanisms, initial movement of the first board along the surface of the second board occurs without being accompanied by interaction of the connectors, so as to avoid possible damage to the connectors that might otherwise occur over time due to friction as the boards are repeatedly assembled and disassembled.

For example, in one such mechanism, the first board is slid inward relative to the second board until the respective connectors on the first and second boards are generally aligned with one another. A hinged connection is then established between the inner corner of the first board and the second board. Subsequently, the first board is rotated toward the surface of the second board until the connectors associated with the two boards are coupled. Further for example, in another such mechanism, the first board is slid inward relative to the second board until the respective connectors are aligned, and then the two boards are compressed together by way of a lever or handle to couple the connectors. In yet another mechanism, a special subchassis is added between the boards to facilitate the desired motion of the first board along the surface of the second board.

Although conventional mechanisms of the above types allow for a first board to be connected to a second board in a manner that does not involve a significant degree of normal movement of the first board relative to the surface of the second board, all of these conventional mechanisms require significant numbers of complicated components to achieve their intended manners of operation. Additionally, in the embodiments where levers/handles are used, the physical feedback provided to a user performing the installation procedure is limited. Further, in the embodiments where the first board is rotated in relation to the second board, the number and positioning of the connectors must be restricted near the hinge since the rotational movement could otherwise place significant frictional stress upon connectors located near the hinge. Additionally, these previous methods also typically depend upon a multiplicity of motions being imparted by users in order to fully engage the cards, which can lead to both confusion and incomplete card installation.

For at least these reasons, it would be advantageous if an improved apparatus and method for assembling together support structures such as boards and cards used in computerized devices could be developed. More particularly, it would be advantageous if in at least some embodiments the improved apparatus and method in at least some embodiments allowed for the assembly of such support structures in a manner that involved only limited amounts of normal movement of one structure relative to a surface of another structure. Additionally, it would be advantageous if in at least some embodiments the improved apparatus and method involved less complicated components than those employed in the above-described conventional mechanisms involving hinges, levers, handles, or sub-chassis. Further, it would be advantageous if in at least some embodiments the improved apparatus and method achieved assembly of the support structures in a manner that did not result in significant frictional stress being placed on the connectors used to establish electrical connections among the support structures. Also, it would be advantageous if, in at least some embodiments of the improved apparatus and method, the movement(s) required to be imparted by users in assembling the support structures were simpler than those typically performed in assembling conventional mechanisms.

BRIEF SUMMARY OF THE INVENTION

The present invention in at least some embodiments relates to an apparatus for installing a first panel-type structure having a first electrical connector in relation to an other structure having a second electrical connector. The apparatus includes a first structure, a second structure supported by the first structure and capable of movement with respect to the first structure along a first direction, and a third structure slidingly supported by the second structure. Sliding motion of the third structure with respect to the second structure results in movement of the third structure relative to the first structure that is along a second direction different from the first direction.

Additionally, in at least some embodiments, the present invention relates to a printed circuit board assembly of a computerized device. The assembly includes a first circuit board structure having a first electrical connection component, and a second circuit board structure having a second electrical connection component that is complementary to the first electrical connection component. The assembly further includes a first support structure extending substantially perpendicularly to a surface of the first circuit board structure, a second support structure supported by the first support structure and configured for first sliding motion with respect to the first support structure along a first direction, and a third support structure supported by the second support structure and configured for second sliding motion with respect to the second support structure along a second direction differing from the first direction. The second circuit board structure is at least one of coupled to and integrally formed as part of the third support structure, and the second sliding motion of the third support structure along the second direction results in relative movement of the second circuit board structure toward or away from the first circuit board structure.

Further, in at least some embodiments, the present invention relates to a method of installing a first panel-type structure in relation to a second panel-type structure within a computerized device. The method includes commencing insertion of a first assembly including the first panel-type structure in relation to a support structure that is at least one of coupled to and integrally formed with the second panel-type structure, where the insertion proceeds along a first direction that is substantially parallel to a surface of the second panel-type structure. Additionally, the method includes causing additional insertion of the first assembly in relation to the support structure along the first direction until a first component of the first assembly reaches a transitional structure, and causing further insertion of a second component of the first assembly in relation to the support structure along the first direction, where the further insertion of the second component causes additional motion of the first component in relation to the second panel-type structure, the additional motion being substantially perpendicular to the surface of the second panel-type structure.

DETAILED DESCRIPTION OF THE PREFERRED EMBODIMENT

Figure 4:
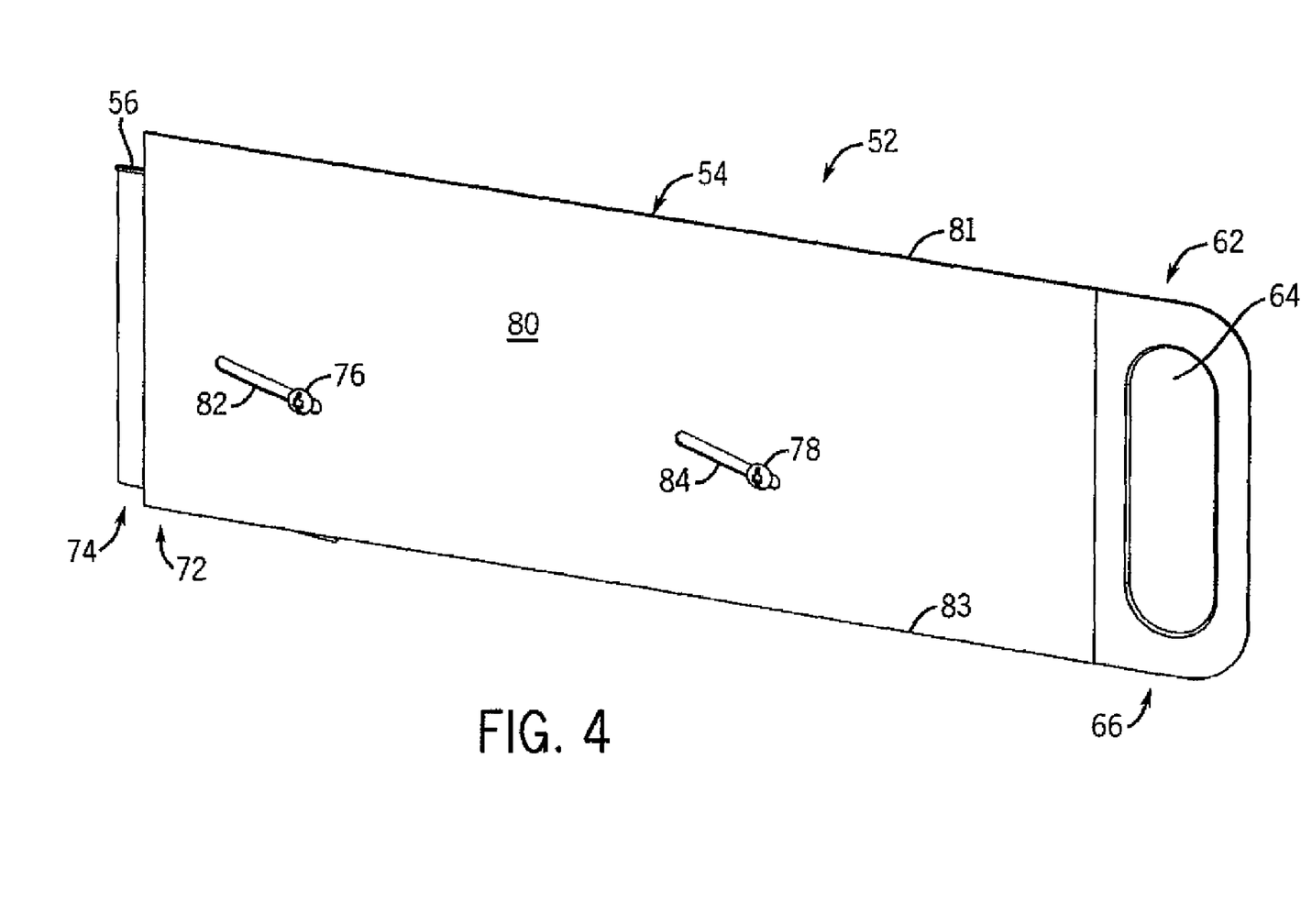
FIG. 4 is an additional perspective view of the combination of the card carrier and carrier guide shown in FIG. 3, showing an opposite side of that combination.
Figure 5:
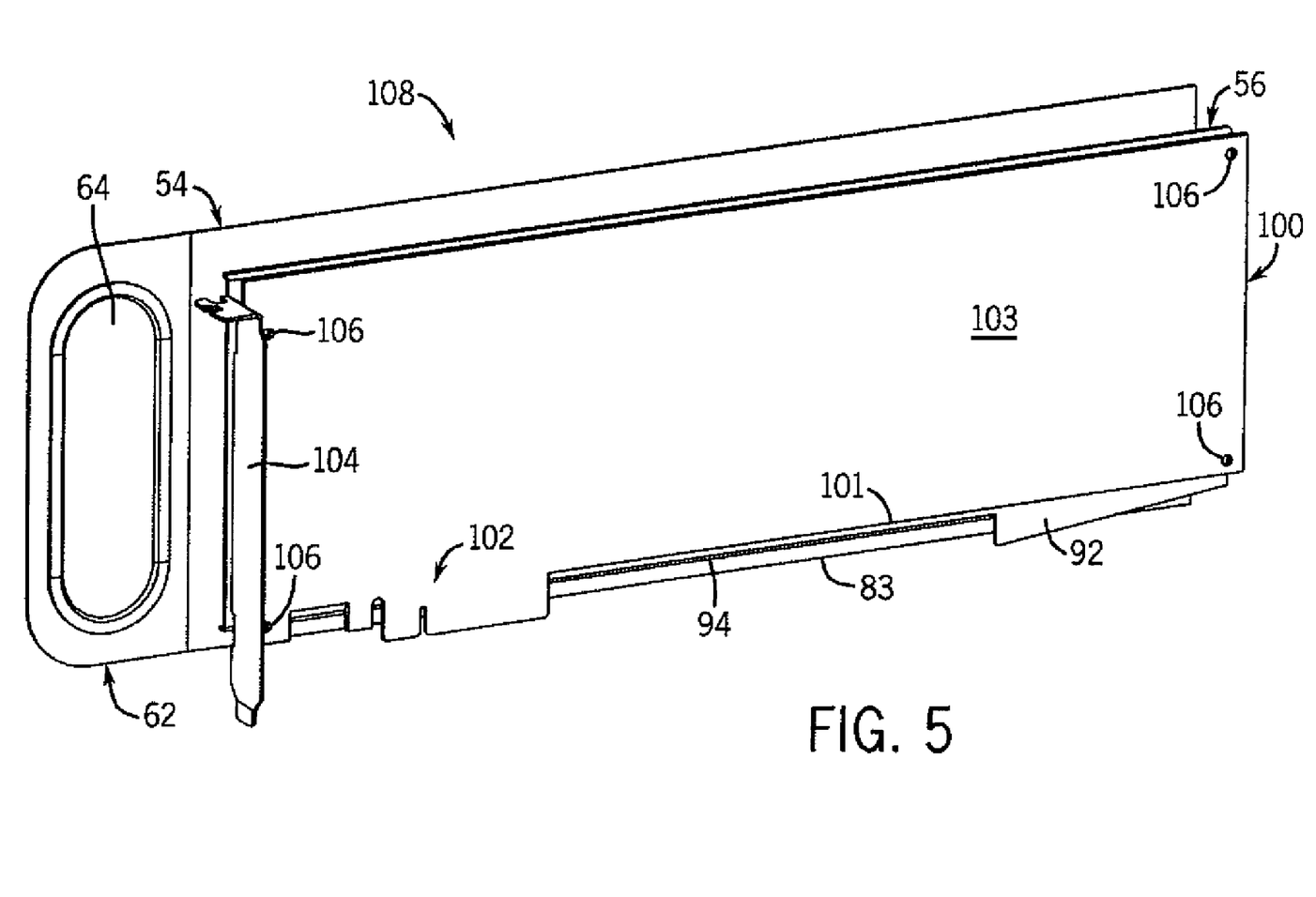
FIG. 5 is a perspective view of the combination of the card carrier and the carrier guide of FIG. 3, further in combination with an additional card mounted thereon.
Figure 6:
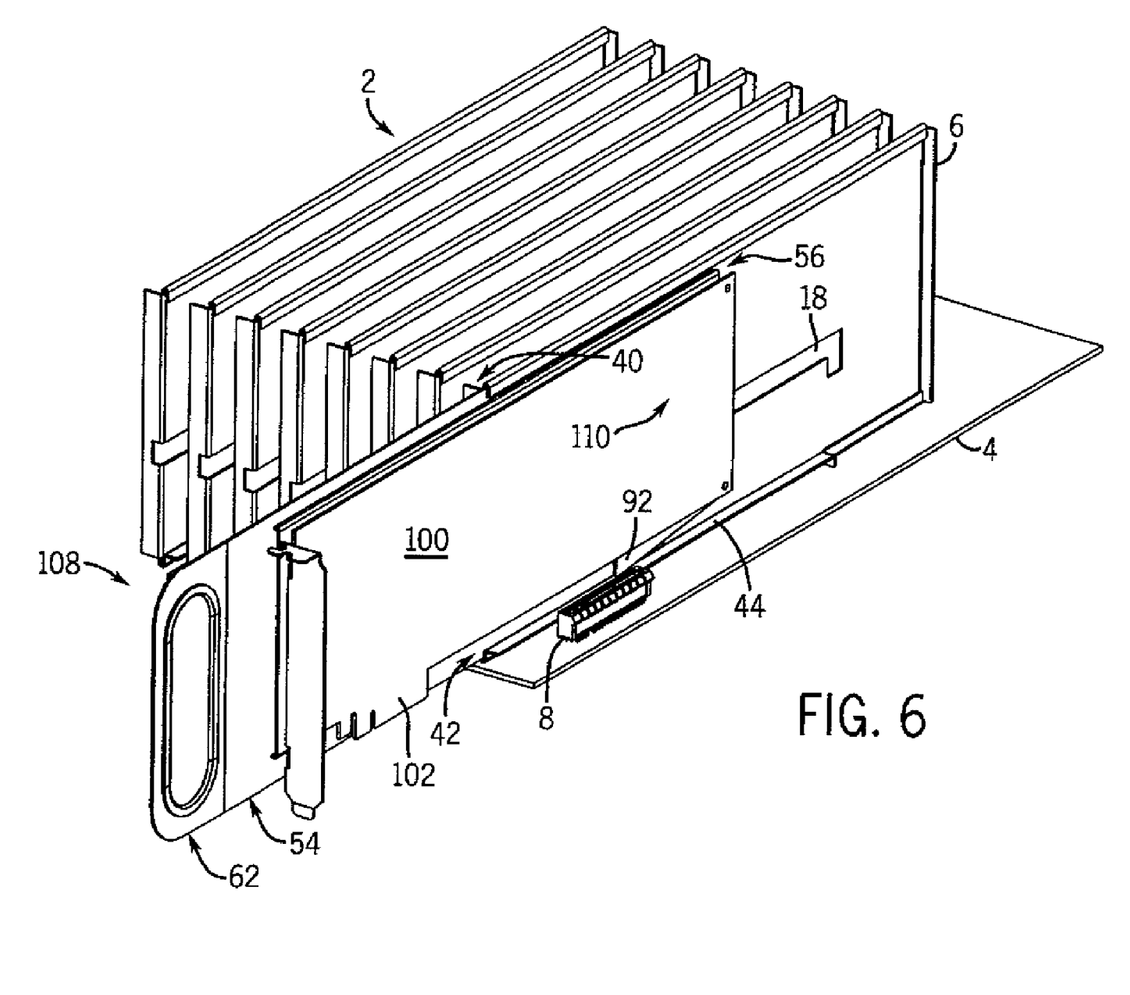
FIG. 6 is a top perspective view of the combination of the card, card carrier and carrier guide of FIG. 5 being mounted onto the chassis guides and backplane of FIG. 1 to form the aforementioned exemplary assembly.
Figure 7:
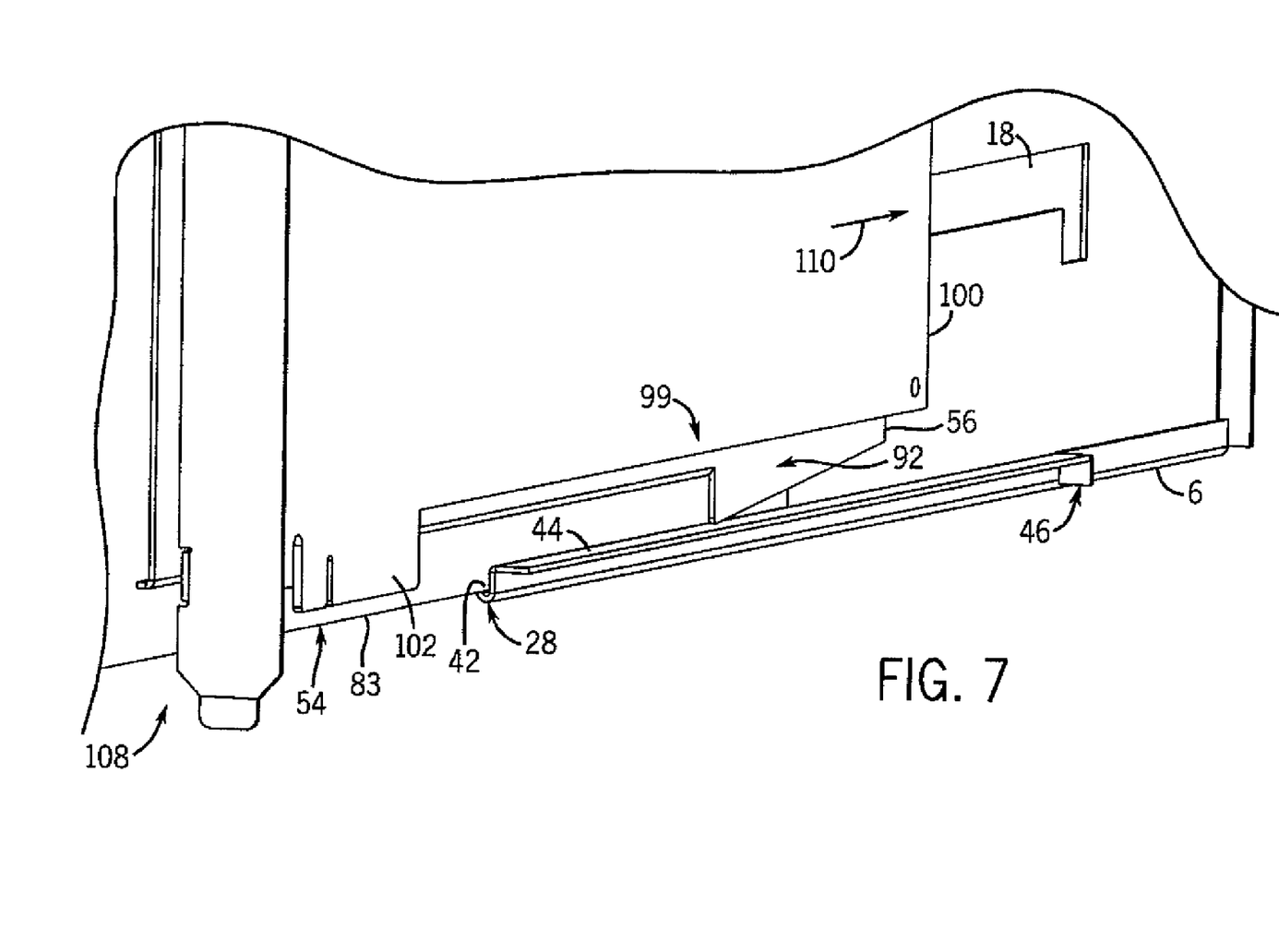
FIG. 7 is an additional perspective cutaway view showing in more detail the combination of the card, card carrier and carrier guide of FIG. 5 being mounted onto one of the chassis guides of FIGS. 1 and 2, with the backplane not being shown.
Figure 8:
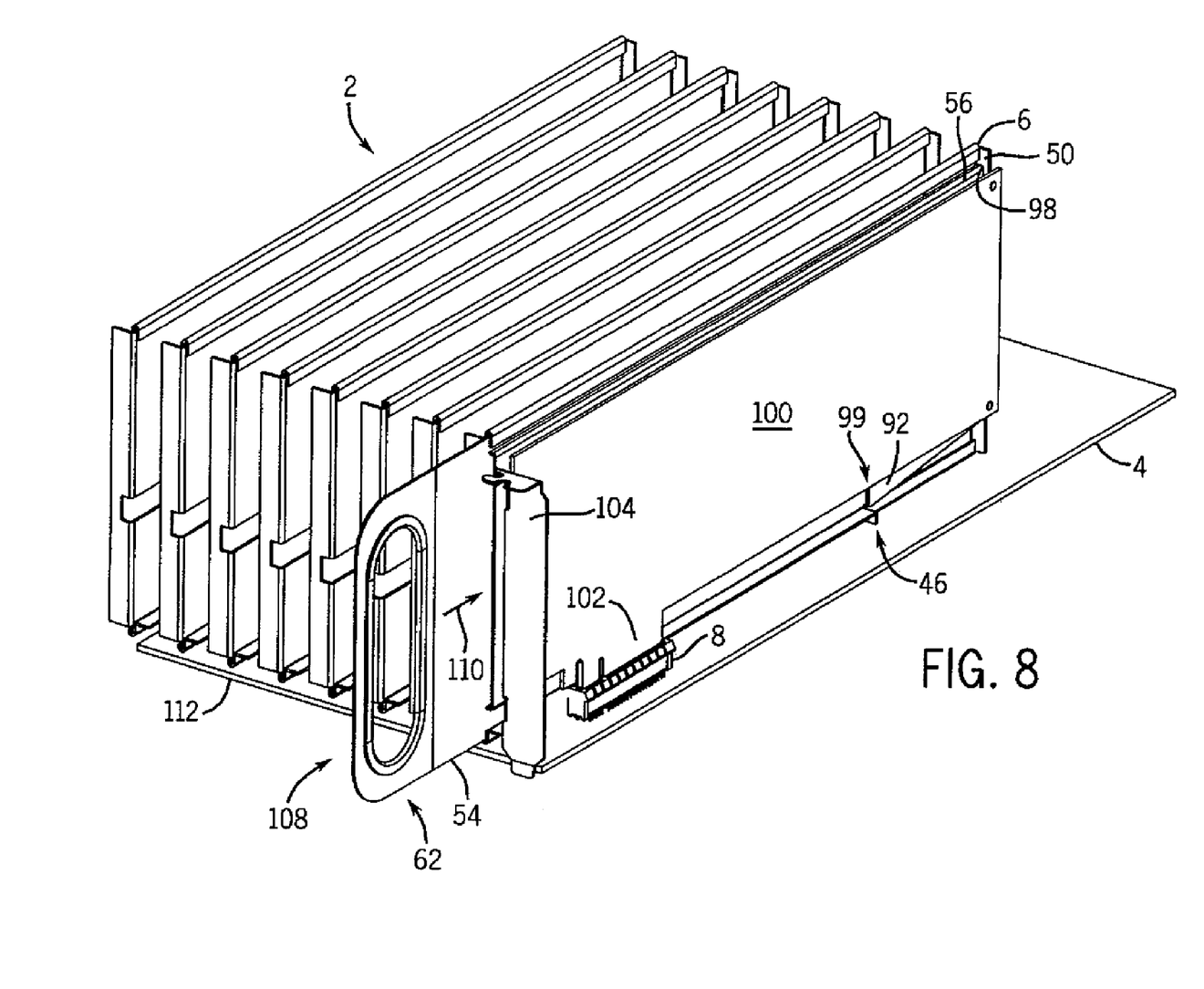
FIG. 8 is a further top perspective view of the exemplary assembly shown in FIG. 6, where the combination of the card, card carrier and carrier guide are shown to be inserted further into the chassis guide.
Figure 9:
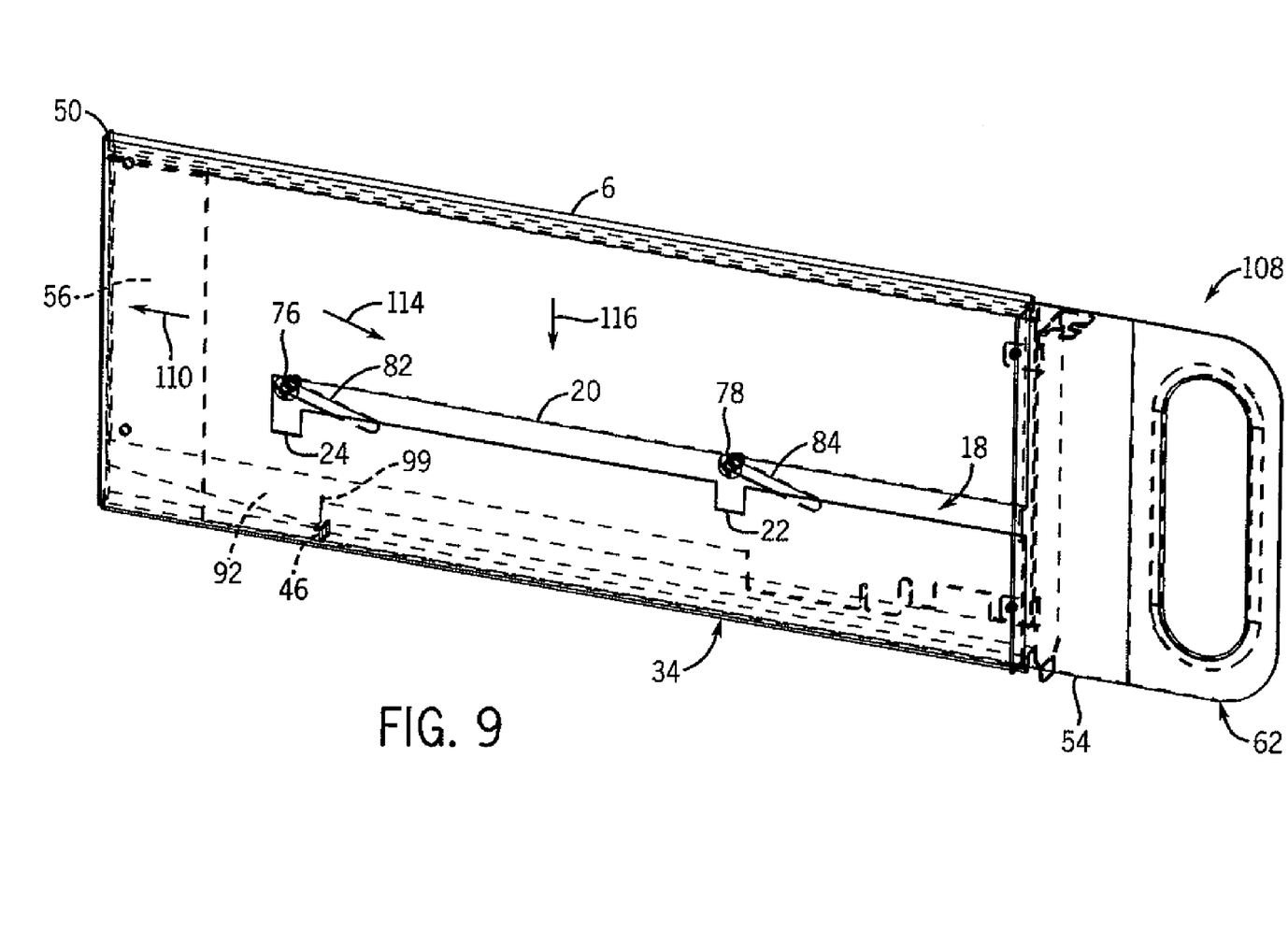
FIG. 9 is an additional perspective view showing an opposite side of the card, card carrier, carrier guide and chassis guide of FIG. 8 (with the backplane not shown), which is provided to further clarify the relative positioning of those components when those components are inserted into the chassis guide to the extent shown in FIG. 8.
Figure 10:
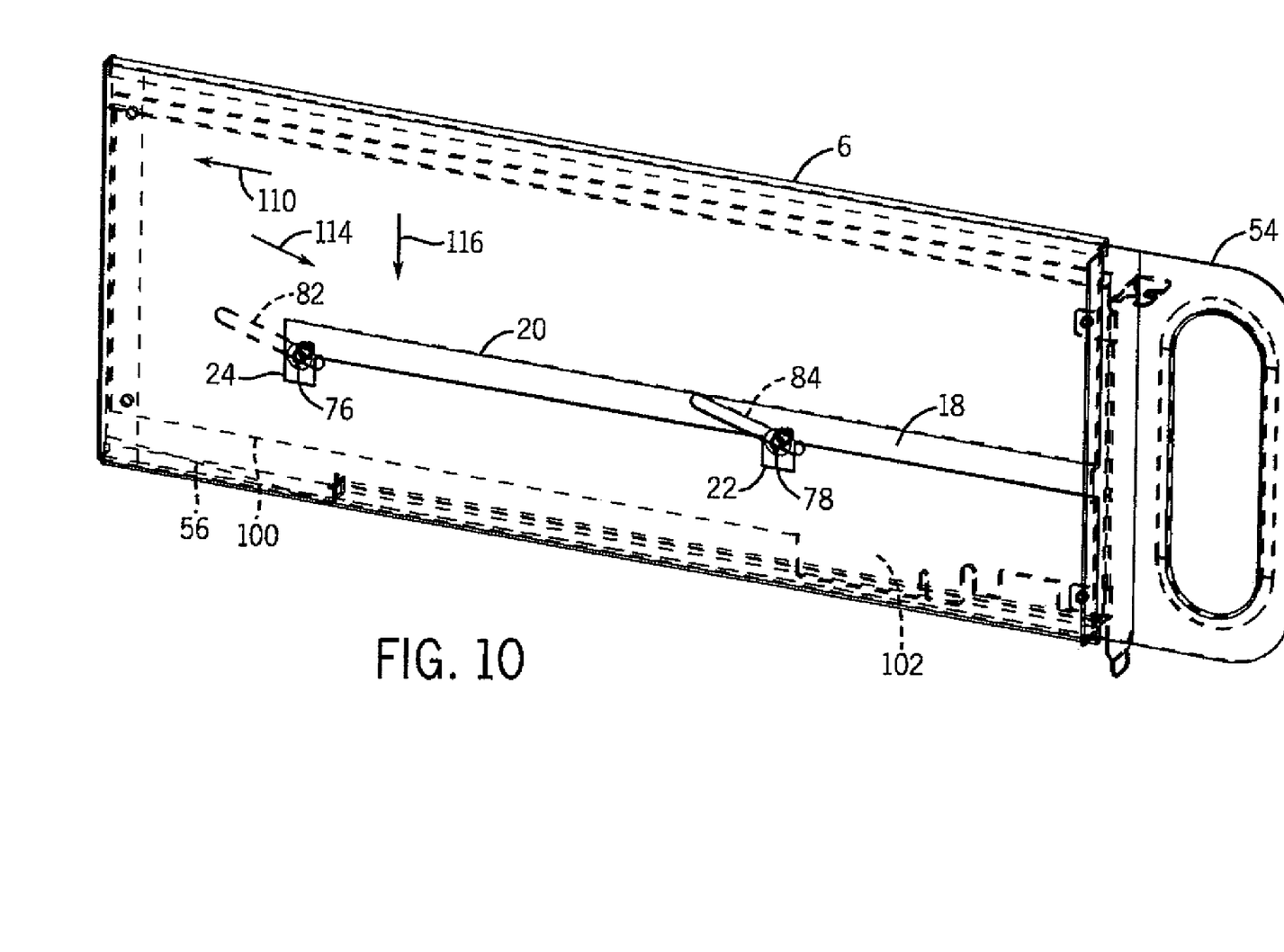
FIG. 10 is an additional perspective view showing an opposite side of the card, card carrier, carrier guide and chassis guide of FIG. 11 (with the backplane not shown), which is provided to further clarify the relative positioning of those components when those components are fully inserted with respect to the chassis guide.
Figure 11:
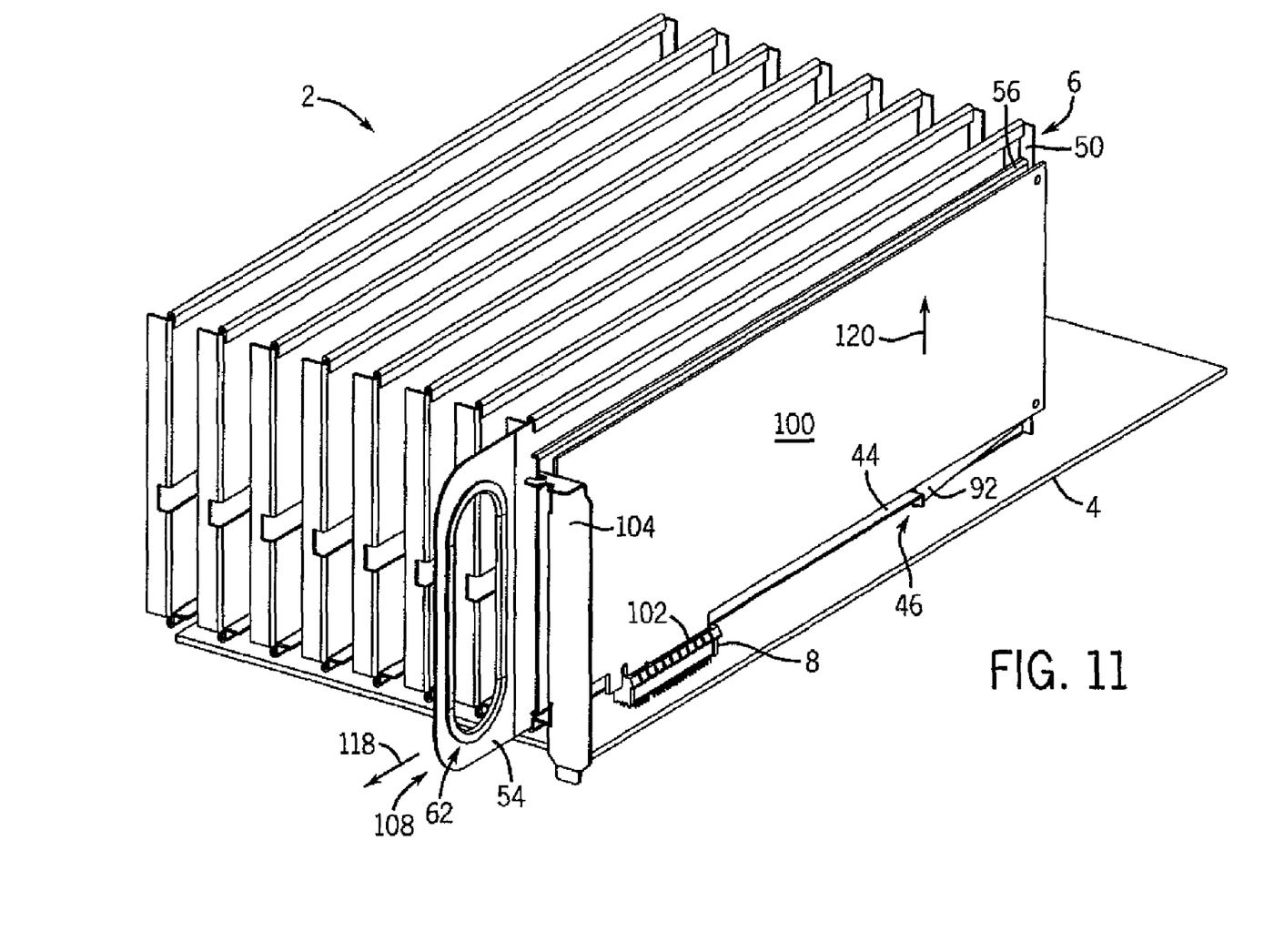
FIG. 11 is a further top perspective view of the exemplary assembly shown in FIGS. 6 and 8, where the combination of the card, card carrier and carrier guide are shown to be fully inserted with respect to the chassis guide and the backplane.

Referring generally to FIGS. 1-11, and particularly to FIGS. 6, 8 and 11, an exemplary assembly 2 is shown that includes a card 100 and a backplane board 4, as can be implemented in a computer or other computerized device (not shown). As will be described below, the assembly 2 includes additional components that allow for the card 100, and potentially multiple other cards, to be installed relative to the backplane board 4 in an improved manner.

Although in the present embodiment the assembly 2 includes the card 100 (which can be, for example, a peripheral component interconnect or PCI card) and the backplane board 4, the present invention is intended to encompass a variety of embodiments in which a variety of panel-type structures are coupled together including, for example, a variety of boards such as printed circuit boards and motherboards, a variety of cards such as daughtercards, and other support structures on which one or more electrical components such as processing devices (e.g., a microprocessor or a programmable logic device) and other components are mounted. The present invention can be employed in any device that employs two or more panel-type structures such as boards and cards including, for example, personal computers (e.g., laptop computers, notebook computers or desktop computers), mainframe computers, and/or other computerized devices.

Figure 1:
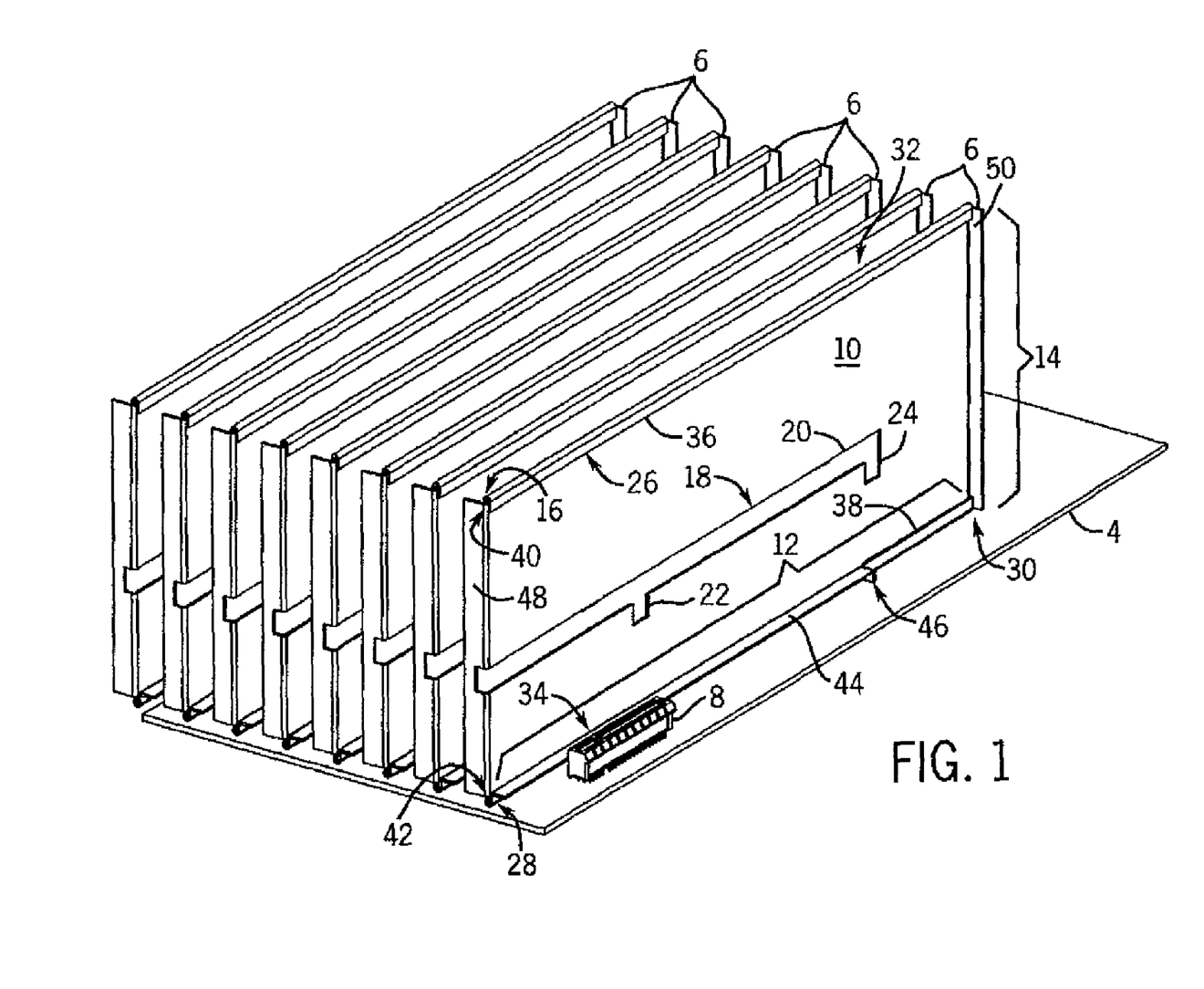
FIG. 1 is a top perspective view of portions of an exemplary assembly in accordance with at least some embodiments of the present invention, where the assembly includes a backplane and a plurality of chassis guides.

Referring in particular to FIG. 1, portions of the assembly 2 when disassembled are shown. In particular, these portions include the backplane board (or chassis) 4 and eight additional structures, each of which can be termed a chassis guide 6, which are attached to the backplane board 4 by way of screws, welding or any of a variety of other attachment mechanisms. As shown, the chassis guides 6 respectively extend parallel to one another, and also extend outward (or upward) from the backplane board 4 in a normal or perpendicular manner. Although in the present embodiment the assembly 2 includes eight of the chassis guides 6 extending from the backplane board 4, it will be understood that in alternate embodiments a different number than eight of the chassis guides could be employed, for example, only one chassis guide might be employed. Also, in alternate embodiments, one or more chassis guides could extend from the backplane board 4 downward below the backplane board instead of, or in addition to, the one or more chassis guides that extend above the backplane board 4.

Further as shown, the backplane board 4 includes multiple connectors 8 that are respectively arranged on the backplane board 4 adjacent to each respective one of the chassis guides 6 (only one of the connectors 8 is shown in the present embodiment, the others being hidden from view). As described in greater detail with respect to FIGS. 6-11, each of the chassis guides 6 is capable of receiving a card such as the card 100 that, upon being received and loaded onto the assembly 2, is coupled electrically to the respective connector 8 positioned adjacent to the respective one of the chassis guides 6 on which that card is received.

Figure 2:
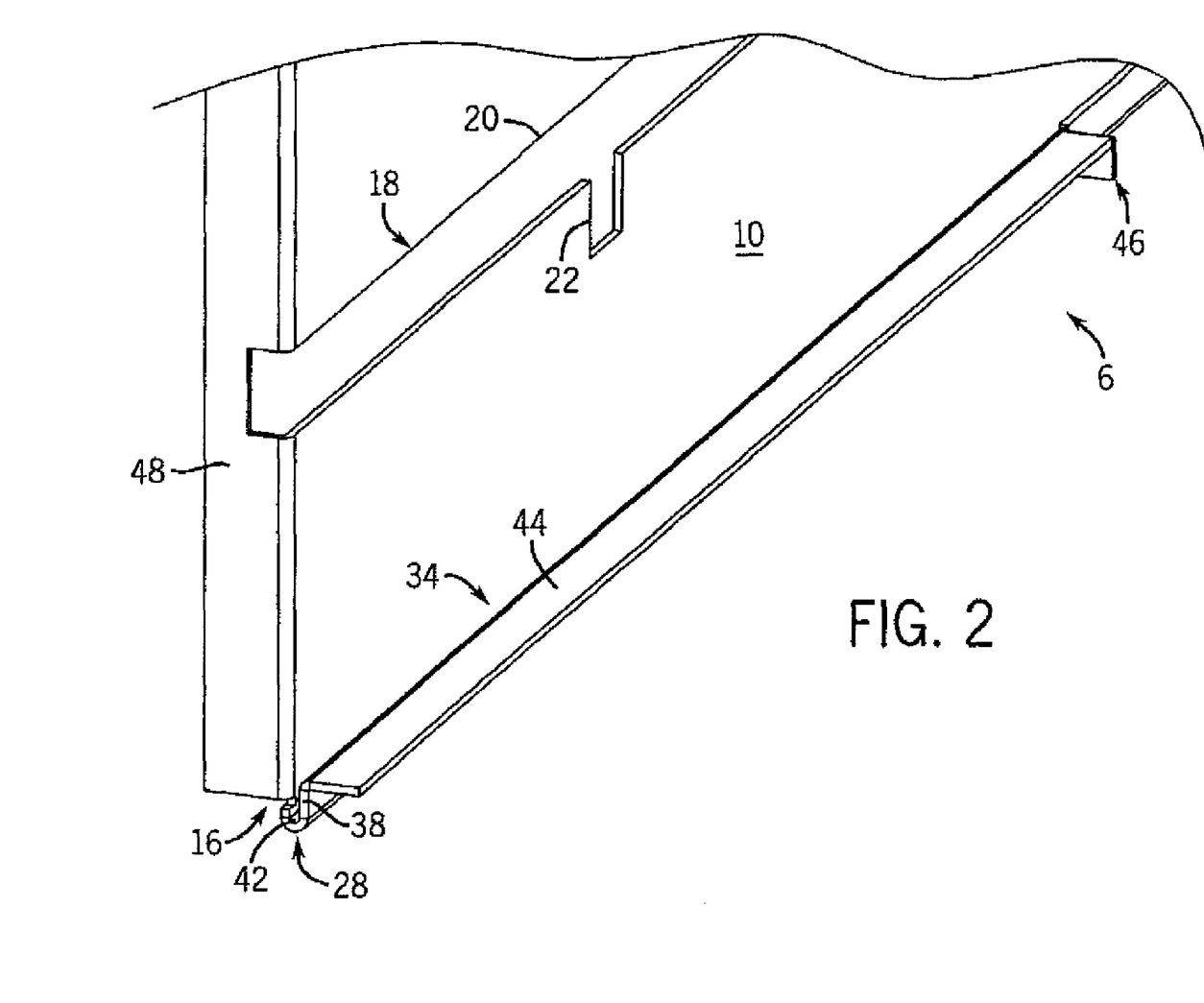
FIG. 2 is a perspective view of a portion of one of the chassis guides of FIG. 1, shown in cutaway.

Referring to FIG. 1 and additionally to FIG. 2, which shows a portion of one of the chassis guides 6 in more detail in cut-away, each of the chassis guides 6 is a substantially rectangular wall having at least one substantially flat surface 10. The chassis guide has a longer dimension 12 and a shorter dimension 14, with the longer dimension 12 being orientated parallel to the plane of the backplane board 4 and the shorter dimension 14 extending generally perpendicularly away from the backplane board. Beginning at a first end 16 of the chassis guide 6, and extending most of the length of the longer dimension 12 toward a second end 30 of the chassis guide, is a slot 18 that generally has the shape of an "F" that is faced down. That is, the slot 18 has a main horizontal slot portion 20, and additionally includes first and second vertical slot portions 22 and 24, respectively, where the second vertical slot portion 24 is at the far end of the horizontal slot portion 20 away from the first end 16, the first vertical slot portion 22 is located midway between the first end 16 and the second vertical slot portion 24, and both of the slot portions 22 and 24 extend from the horizontal slot portion 20 in a direction generally toward the backplane board 4.

In addition to the slot 18, each of the chassis guides 6 includes first and second retaining or grasping portions 26 and 28, respectively, that extend the full length of the longer dimension 12 of the chassis guide from the first end 16 to the second end 30 along upper and lower edges 32 and 34 of the chassis guide, respectively. The grasping portions 26 and 28 effectively are overhanging extensions of the substantially flat surface 10 of the chassis guide 6 that extend so as to form first and second flanges or lips 36 and 38, respectively, such that the grasping portions 26 and 28 generally each have a hook-shaped cross section. Further as shown, due to the presence of the grasping portions 26 and 28 with their respective lips 36 and 38, first and second grooves 40 and 42 are formed between the respective lips 36 and 38 and the substantially flat portion 10 of the chassis guide 6 (see in particular FIG. 2).

Although the grasping portions 26 and 28 generally extend the entire length of the chassis guide 6, the second grasping portion 28 additionally includes a further extension that is a shelf portion 44 that extends from the second lip 38 in a direction that is generally outward away from the substantially flat surface 10 in a direction generally normal thereto. As shown in FIG. 1, the shelf portion 44 does not extend along the lip 38 all of the way from the first end 16 to the second end 30 but rather only extends from the first end 16 approximately three-quarters of the distance along the longer dimension 12 up to a location 46, after which point the lip 38 continues without any such additional extension (in the embodiment shown, at the location 46 the shelf portion 44 includes a downturned flange portion).

Finally, as also shown in FIG. 1, each of the chassis guides 6 includes first and second additional extensions 48 and 50, respectively, extending in directions that are generally perpendicular with respect to the substantially flat surface 10 along the first end 16 and the second end 30, respectively. The second additional extension 50 extends outward in relation to the surface 10, along the same side of the surface 10 as are situated the lips 36 and 38 and the shelf portion 44, while the first additional extension 48 extends generally the opposite direction.

Figure 3:
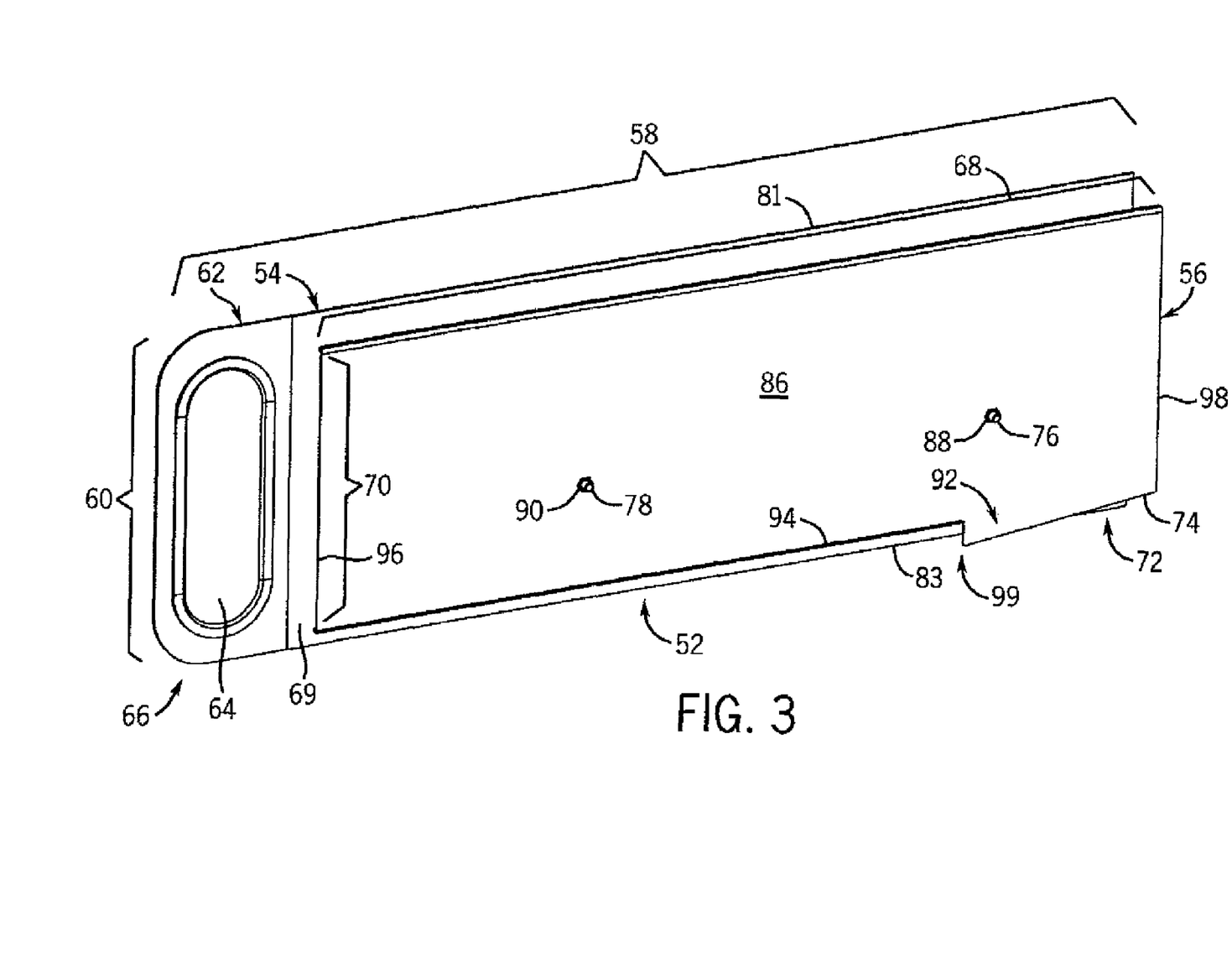
FIG. 3 is a perspective view of the combination of a card carrier and a carrier guide, which can be mounted onto one of the chassis guides of FIGS. 1 and 2.

Turning to FIGS. 3 and 4, each of the chassis guides 6 is configured to receive an additional assembly 52 that includes two components, namely, a carrier guide 54 and a card carrier 56. FIG. 3 shows one side of the additional assembly 52, while FIG. 4 shows the opposite side of the additional assembly. As shown, the carrier guide 54 is a substantially rectangularly-shaped panel having a longer dimension 58 and a shorter dimension 60 and also having a handle 62 formed by way of an oval-shaped orifice 64 existing proximate a first end 66 of the carrier guide 54, such that the overall appearance of the carrier guide is similar to that of a saw (without teeth). As for the card carrier 56, that structure is also generally rectangularly-shaped, with a longer dimension 68 and a shorter dimension 70. The card carrier 56 is positioned along a flat front side 69 of the carrier guide 54, and extends substantially from the handle 62 of the carrier guide away from the first end 66 to and beyond a second end 72 of the carrier guide, such that the card carrier 56 includes an overhang portion 74 that extends beyond the carrier guide 54.

Further as shown, the carrier guide 54 supports the card carrier 56 by way of first and second screws 76 and 78 that, as shown best in FIG. 4, extend from a reverse side 80 of the carrier guide, through first and second slots 82 and 84 formed in the carrier guide, respectively, and through corresponding first and second holes (not shown) within the card carrier 56. First and second nuts 88 and 90 are respectively affixed to the respective ends of the respective screws 76 and 78 that extend past a front side 86 of the card carrier 56, such that the card carrier is 56 held against the carrier guide 54. In at least some embodiments, the nuts 88, 90 can be peanuts. In alternate embodiments, other fastening devices other than screws and nuts can also be used to couple the card carrier 56 to the carrier guide 54.

As is evident from FIG. 4, each of the slots 82 and 84 is linear but follows a path that is oblique or inclined relative to the edges of the rectangular carrier guide 54. More particularly, each of the slots 82, 84 follows a linear path that is slightly slanted relative to upper and lower edges 81 and 83, respectively, of the carrier guide 54 (e.g., extending at an angle of approximately 20 degrees relative to those edges). Due to the arrangement of the slots 82, 84, screws 76, 78, and nuts 88, 90, the card carrier 56 is capable of relative movement with respect to the card carrier guide 54. That is, the card carrier 56 can be slid relative to the carrier guide 54 with such sliding movement corresponding to movement of the screws 76, 78 within the slots 82, 84, the inner linear surfaces of which effectively serve as ramps. Because the slots 82, 84 are not oblique with respect to the edges 81, 83 of the carrier guide 54, such relative sliding movement of the card carrier 56 with respect to the carrier guide 54 results in relatively diagonal movement of the card carrier with respect to each of the dimensions 58 and 60 of the carrier guide 54.

Referring still to FIGS. 3 and 4 and, in particular to FIG. 3, the card carrier 56 is not strictly rectangular but rather has an additional ramp feature 92 along that one of its edges that is closest to the lower edge 83 of the carrier guide 54. More particularly, while the card carrier 56 has a straight lower edge 94 that extends from a first end 96 toward a second end 98, generally parallel to the lower edge 83 of the carrier guide 54, the straight lower edge 94 does not extend all of the way to the second end 98 but rather extends only approximately three-quarters of that distance to a location 99. At the location 99, a discontinuity occurs in the edge 94 such that the width of the card carrier 56 increases beyond the shorter dimension 70 and then, following this location 99, the width of the card carrier 56 then gradually is reduced back to approximately that of the shorter dimension as one continues toward the second end 98 in an inclined manner. The angle of the incline of the ramp feature 92 relative to the straight lower edge 94 typically is, but need not be, identical to the angle of the slots 82 and 84 relative to the edges 81, 83.

Turning to FIG. 5, the assembly 52 having the carrier guide 54 and the card carrier 56 is intended to support the card 100, which can have a generally rectangular shape that is similar in dimensions to that of the card carrier 56, albeit without any ramp feature corresponding to the ramp feature 92. As shown, the card 100 includes a connector 102 along a lower longitudinal edge 101 that runs substantially parallel to and proximate the edges 83 and 94, where the connector is designed to interface one of the connectors 8 mounted upon the backplane board 4. The connector 102 generally protrudes in a direction outward away from the card 100 that is generally the same as the direction in which the ramp feature 92 protrudes outward from the card carrier 56.

The card 100 can be assembled to the card carrier 56 in any of a variety of ways including, for example, by way of a plurality of screws 106 such as are shown in FIG. 5, and the card carrier 56, carrier guide 54 and card 100 collectively can be understood to form a further assembly 108. Although the card 100 is distinct from the card carrier 56 in the present embodiment, in alternate embodiments the two components could be combined as a single component having both a connector such as the connector 8 and a ramp feature such as the ramp feature 92. In the present embodiment, the card 100 also includes a bulkhead 104 that protrudes outward from the remainder of the card, substantially perpendicular to a flat surface 103 of the card, to the front side 86 of the card carrier 56, and to the flat surface 69 of the carrier guide 54.

Turning next to FIGS. 6-11, the further assembly 108 can be installed in relation to one of the chassis guides 6 and the backplane board 4 to form the assembly 2, such that the card 100 is electrically coupled to the backplane board, as follows. As shown particularly in FIG. 6, installation begins by inserting the carrier guide 54 into the grooves 40 and 42 of one of the chassis guides 6 (e.g., inserting the upper and lower edges 81, 83 into those grooves), and then generally pushing the assembly 108 further alongside the substantially flat surface 10 of the chassis guide 6 along a direction indicated by an arrow 110. This pushing movement can be performed by an operator who is pushing the overall assembly 108 by way of the handle 62, albeit in alternate embodiments it could also be achieved automatically by way of a motorized device or otherwise.

Referring additionally to FIG. 7, of particular interest as the assembly 108 is inserted into the chassis guide 6 is the interfacing between the ramp feature 92 of the card carrier 56 and the shelf portion 44 of the chassis guide. In particular, as shown, while the lower edge 83 of the carrier guide 54 fits within the groove 42 formed by the grasping portion 28, the card carrier 56 with the ramp feature 92 is set sufficiently far enough away from the flat surface 10 of the chassis guide 6 that the ramp feature rests upon the extension 44. Consequently, as the assembly 108 is being inserted relative to the chassis guide 6 along the direction of the arrow 110, the card carrier 56 and the card 100 supported thereon are pushed generally away from the lower edge 83 of the carrier guide 54 that is within the groove 42, and additionally the overhang portion 74 of the card carrier extends outward beyond the carrier guide a maximum amount.

Further as a result, the screws 76 and 78 are respectively positioned at ends of the slots 82 and 84, respectively, that are farthest from the lower edge 83 of the carrier guide (as shown in FIG. 9 discussed below). Thus, the connector 102 is able to pass over the connector 8 without being blocked thereby as the assembly 108 is inserted. It should be noted also that the card 100 with the connector 102 is positioned even farther away from the flat surface 10 of the chassis guide 6 than is the card carrier 56 with its ramp feature 92, and thus the connector 102 is also able to pass alongside the shelf portion 44 rather than being blocked by it.

Turning to FIG. 8, eventually the assembly 108 is pushed inward with respect to the chassis guide 6 sufficiently far that the location 99 at which the ramp feature 92 begins on the card carrier 56 passes the location 46 on the chassis guide 6. The relative dimensions of the card carrier 56 and the chassis guide 6 are also set so that, when the alignment of the locations 99 and 46 occurs, the second end 98 of the card carrier 56 encounters the second additional extension 50 of the chassis guide 6. As a result, as the handle 62 of the carrier guide 54 continues to be pushed inward along the direction of the arrow 110, further movement of the card carrier 56 in that direction is precluded. Additionally, when the locations 99 and 46 are initially aligned, the card carrier 56 is positioned such that the connector 102 of the card 100 is positioned adjacent to the connector 8.

FIG. 9 shows the reverse side of the chassis guide 6 with respect to which the assembly 108 is being installed in FIG. 8, with the backplane board 4 not shown and portions of the assembly 108 situated along the surface 10 of the chassis guide being shown in phantom. FIG. 9 shows how the slot 18 of the chassis guide 6 accommodates the screws 76, 78 of the assembly 108 as that assembly is pushed inward. More particularly, FIG. 9 shows the locations of the screws 78, 76 when the locations 99 and 46 are initially aligned as shown in FIG. 8, with the screws 78, 76 still being both positioned within the horizontal slot portion 20 and at the same time being respectively aligned with the first and second vertical slot portions 22 and 24, respectively.

As a result of the interaction between the second end 98 of the card carrier 56 and the extension 50 of the chassis guide 6, further movement of the carrier guide 54 inward in relation to the chassis guide 6 does not result in further inward movement of the card carrier 56 or the card 100. Rather, such movement causes relative movement to occur between the card carrier 56 and the carrier guide 54, which in turn results in relative movement between the card 100 and the chassis guide 6/backplane board 4 such that the card 100 moves generally toward the backplane board 4. Thus, while linear movement of the carrier guide 54 along a direction that is parallel to both the flat surface 10 of the chassis guide 6 as well as the backplane board 4 initially results in insertion of the assembly 108 into the chassis guide 6, continued linear movement of the carrier guide in this direction causes motion of the card carrier 56 and card 100 that is still parallel to the flat surface of the chassis guide but is perpendicular or normal to the backplane board.

As best indicated by FIG. 9 and additionally FIG. 10, such relative movement of the card carrier 56 with respect to the carrier guide 54 is determined by the screws 76, 78 and slots 82, 84, with the respective screws 78, 76 generally moving through the respective slots 82, 84 along a direction indicated by an arrow 114. That is, as the carrier guide 54 continues to move inward toward the extension 50 of the chassis guide 6 along the direction indicated by the arrow 110 but the card carrier 56 is precluded from so moving, the card carrier 56 moves relative to the carrier guide 54 along the direction indicated by the arrow 114 as governed by the interaction between the screws 78, 76 and the slots 82, 84. Further, although the card carrier 56 moves relative to the carrier guide 54 along the direction indicated by the arrow 114, the movement of the card carrier 56 relative to the chassis guide 6 and the backplane board 4 follows a different path as indicated by an arrow 116. That is, since the card carrier 56 is precluded from moving along the direction indicated by the arrow 110 by the extension 50, the card carrier 56 merely moves toward the lower edge 34 of the chassis guide 6.

As a result of these interactions among the chassis guide 6, the carrier guide 54, and the card carrier 56, these components and the card 100 eventually attain a final installed position when the carrier guide 54 moves as far inward into the chassis guide 6 along the direction of the arrow 110 as is possible. Further movement of any of these components becomes impossible when the carrier guide 54 encounters the extension 50 of the chassis guide 6, and/or when the screws 76, 78 have moved all of the way through the slots 82, 84 from the position shown in FIG. 9 to positions at the opposite ends of the slots as shown in FIG. 10. In particular, when the final installed position of these components is attained, the screws 78, 76 have respectively moved within the respective slots 82, 84 from the positions shown in FIG. 9 to the positions shown in FIG. 10, which are closer to the lower edge 34 of the chassis guide 6 and to the backplane board 4.

As is particularly evident in FIG. 10, the movement of the screws 78, 76 along the direction of the arrow 114 within the slots 82, 84 corresponds to vertical motion of the respective screws along the direction indicated by the arrow 116, both within the respective vertical slot portions 22 and 24 of the chassis guide and also with respect to the backplane board 4. That is, the screws 78, 76 move out of the horizontal slot portion 20 and into the vertical slot portions 22, 24. Consequently, relative movement of the screws 76, 78 with respect to the chassis guide 6 along or in opposition to the direction indicated by the arrow 110 is precluded. For this reason, the card carrier 56 and the card 100 supported by the card carrier become locked in place, with movement along the direction indicated by the arrow 110 or in the opposite direction being precluded.

Having been installed in this manner, the screws 76 and 78, together with the card carrier 56 and the card 100 all have moved maximally along the direction indicated by the arrow 116 in relation to the chassis guide 6. Thus, referring additionally to FIG. 11, the card 100 is now positioned more closely to the backplane board 4 than before (e.g., as shown in FIG. 8), and the connector 102 has been fully inserted into the complementary connector 8 on the backplane board. Thus, the card 100 is electrically coupled to the backplane board 4.

Removal of the card 100 from the backplane board 4 is achieved by pulling the carrier guide 54 by way of the handle 62 in a direction indicated by an arrow 118 shown in FIG. 11, which is opposite the direction indicated by the arrow 110 discussed earlier. When pulling of the carrier guide 54 in this direction occurs, the ramp feature 92 initially is abutting the shelf portion 44 at the location 46 such that the card carrier 56 and the card 100 cannot be pulled in the direction of the arrow 118. Rather, as a result of the interaction between the screws 78, 76 and the slots 82, 84, pulling of the carrier guide 54 at this time causes the card carrier 56 and the card 100 to move up away from the backplane board 4 along a direction indicated by an arrow 120. As this happens, the connector 102 disengages from the connector 8.

Eventually, the card carrier 56 has moved sufficiently far upward that the ramp feature 92 clears the shelf portion 44. At that point, the entire assembly 108 including the carrier guide 54, the card carrier 56 and the card 100 all are able to move outward along the direction of the arrow 118 as the handle 62 is pulled away from the chassis guide 6, and thus the entire assembly 108 can then be removed from the chassis guide and the backplane board 4.

The above-described assembly 2 provides an improved manner of assembling and disassembling panel-type structures that are intended to be coupled in a perpendicular manner, and where electrical connection of the panel-type structures requires at least some movement of one of the panel-type structures in a direction that is normal to a surface of another of the panel-type structures. This is because, although the resulting assembly 2 has perpendicularly-oriented panel-type structures (e.g., the backplane board 4 and the card 100), the manner of assembling these panel-type structures described above only requires an operator to provide a single motion along the direction of the arrow 110 parallel to the surface of the backplane board 4, and does not require an operator to provide motion normal to the surface of the backplane board. Rather, the interaction of the components of the assembly 2 automatically transforms some motion of the former type into motion of the latter type. That is, movement of the card 100 in the direction indicated by the arrow 110 is partially converted by way of the screws 76, 78 and the slots 82, 84 and the interaction among the chassis guide 6, the carrier guide 54 and the card carrier 56 partially into motion that is normal to the surface of the backplane board 4. As a result, insertion of the card 100 by way of the presently-described method is easier and simpler in comparison with many conventional manners of installing cards that require complicated motions to be imparted by users when installing the cards.

Although the above-described embodiment is one example of a system that facilitates the insertion of a card, board or similar structure in relation to a backplane board, motherboard, other type of board, card or other similar structure of a computerized device, this embodiment is only intended to be exemplary and the present invention is intended to encompass many other variations of the system. For example, while the slots 82, 84 and the ramp feature 92 all have generally inclined guiding surfaces that are straight, in other embodiments of the invention the surfaces could be curved. Indeed, the particular interfacing guiding surfaces provided in the present embodiment of the invention, e.g., by the slots 82, 84, screws 76, 78, ramp features 92, shelf portion 44, in alternate embodiments could take a variety of other forms. For example, in one alternate embodiment oblique slots could be provided on the card carrier 56, and screws or other protrusions for interfacing those slots could be provided on the card guide 54.

Further, while various descriptive terms have been employed above to convey relative positional arrangements of components (for example, "vertical", "horizontal", "upward", etc.), these terms have only been employed as a convenience to facilitate an understanding of relative orientations and positions of components, and are not intended to limit the scope of the present invention to embodiments having any particular orientation with respect to the ground or otherwise (e.g., the above description is not intended to suggest that all embodiments of the present invention need have a backplane board that is vertically lower or positioned closer to the ground than other components). Rather, the present invention is also intended to encompass a variety of embodiments in which the relative orientations and positions of components differ from those described above. Also, in some embodiments, certain components corresponding to those described above could be combined with, or even integrally formed with, other components. For example, as mentioned above, in some embodiments, a structure having electronic components such as the card 100 (or the backplane board 4) could be integrally formed with a structure such as the card carrier 56 (or the chassis guide 6).

Additionally, while the backplane board 4, the chassis guide 6, the carrier guide 54 and the card carrier 56 all are shown to be generally planar structures in the present embodiment, the present invention is intended to encompass a variety of other embodiments in which these structures are not necessarily completely planar. The present invention is intended to encompass a variety of embodiments in which an interrelationship of components allows for movement of components to occur in one direction and yet further results in movement along a different direction so as to achieve coupling or decoupling of connectors or other components.

It is specifically intended that the present invention not be limited to the embodiments and illustrations contained herein, but include modified forms of those embodiments including portions of the embodiments and combinations of elements of different embodiments as come within the scope of the following claims.

I claim:

1. An apparatus for installing a first panel-type structure having a first electrical connector in relation to an other structure having a second electrical connector, the apparatus comprising:
   a first structure;
   a second structure supported by the first structure and capable of movement with respect to the first structure along a first direction; and
   a third structure slidingly supported by the second structure,
   wherein sliding motion of the second structure with respect to the first structure in the first direction results in movement of the third structure relative to both the first and second structures, wherein the movement of the third structure relative to the first structure is along a second direction different from the first direction.

2. The apparatus of claim 1, wherein the second direction is substantially perpendicular to the first direction, and wherein the movement of the third structure with respect to the second structure only occurs after the second structure has been partially inserted with respect to the first structure.

3. An assembly including the apparatus of claim 1, wherein the first structure is one of coupled to and integrally formed with respect to the other structure, and wherein the second direction is toward the other structure.

4. The apparatus of claim 1, wherein the first structure includes a support feature that includes a lip that forms a groove within which an edge of the second structure can slide.

5. The apparatus of claim 1, wherein the second structure includes first and second slots within which are positioned first and second oblique guiding surfaces, respectively, and wherein first and second protrusions attached to the third structure protrude through the first and second slots, the movement of the third structure being determined by guiding of the first and second protrusions along the first and second oblique surfaces.

6. The apparatus of claim 1, wherein the first structure includes a supporting flange along a first portion of a first side of the first structure, wherein the third structure includes an extended feature along a second portion of a second side of the third structure, and wherein the extended feature rides along the supporting flange from a first time at which the second structure is first inserted with respect to the first structure until a second time at which the extended feature passes an end location of the supporting flange.

7. The apparatus of claim 1, wherein the first structure includes a slot having a first portion that extends substantially parallel to the first direction and a second portion that extends substantially perpendicularly to the first portion, wherein at least one protrusion extending out of the second structure extends at least partly into the slot, and wherein the at least one protrusion extends into the second portion of the slot after the movement of the third structure relative to the first structure along the second direction has occurred.

8. The apparatus of claim 1, wherein the second structure includes a handle allowing for manual insertion of the second structure in relation to the first structure.

9. The assembly of claim 3, wherein the other structure is a second panel-type structure and the second electrical connector is complementary to the first electrical connector.

10. The assembly of claim 3, wherein the other structure is one of a backplane board and motherboard.

11. A combination device comprising the assembly of claim 3 and further comprising the first panel-type structure, the first panel-type structure being one of a printed circuit board and a daughtercard.

12. A combination device comprising the assembly of claim 3 and further comprising the first panel-type structure and an additional panel-type structure, wherein both of the first and additional panel-type structures are coupled at least indirectly to the other structure.

13. The apparatus of claim 6, wherein the extended feature is a ramp, and wherein the movement of the third structure with respect to the second structure only occurs after the ramp has passed the end location of the supporting flange.

14. The apparatus of claim 6, wherein the movement of the third structure with respect to the second structure only occurs after the third structure has encountered an extension of the first structure precluding further insertion of the third structure with respect to the first structure.

15. The assembly of claim 9, wherein the movement along the second direction results in coupling of the first electrical connector to the second electrical connector.

16. A computerized device comprising the combination device of claim 11.

17. The combination device of claim 11, wherein the first panel-type structure is integrally formed with the third structure.

18. A printed circuit board assembly of a computerized device, the assembly comprising:
- a first circuit board structure having a first electrical connection component;
- a second circuit board structure having a second electrical connection component that is complementary to the first electrical connection component;
- a first support structure extending substantially perpendicularly to a surface of the first circuit board structure;
- a second support structure supported by the first support structure and configured for first sliding motion with respect to the first support structure along a first direction;
- a third support structure supported by the second support structure and configured for second sliding motion with respect to the second support structure along a second direction differing from the first direction;
- wherein the second circuit board structure is at least one of coupled to and integrally formed as part of the third support structure, and
- wherein the second sliding motion of the third support structure along the second direction results in relative movement of the second circuit board structure toward or away from the first circuit board structure.

19. The printed circuit board assembly of claim 18, wherein the first support structure includes a support feature and the third support structure includes a ramping feature, and wherein the relative movement of the second circuit board structure toward or away from the first circuit board structure is precluded when the support feature is between the ramping feature and the first circuit board structure.

20. The printed circuit board assembly of claim 18, further comprising means for guiding the second sliding motion of the third support structure with respect to second support structure along the second direction.

* * * * *

UNITED STATES PATENT AND TRADEMARK OFFICE
CERTIFICATE OF CORRECTION

PATENT NO.        : 7,420,816 B2  
APPLICATION NO.   : 11/532312  
DATED             : September 2, 2008  
INVENTOR(S)       : Brandon Rubenstein

It is certified that error appears in the above-identified patent and that said Letters Patent is hereby corrected as shown below:

In column 6, line 64, delete "peanuts" and insert -- pemnuts --, therefor.

In column 12, line 49, in Claim 10, after "and" insert -- a --.

Signed and Sealed this

Seventeenth Day of February, 2009

JOHN DOLL  
*Acting Director of the United States Patent and Trademark Office*